United States Patent
Val et al.

(10) Patent No.: US 12,313,249 B2
(45) Date of Patent: May 27, 2025

(54) LIGHT-EMITTING MODULE WITH COMPACT CONVERTER CIRCUIT

(71) Applicant: VALEO VISION, Bobigny (FR)

(72) Inventors: Alexandre Val, Bobigny (FR); Sebastian Krick, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 18/560,555

(22) PCT Filed: May 20, 2022

(86) PCT No.: PCT/EP2022/063681
§ 371 (c)(1),
(2) Date: Nov. 13, 2023

(87) PCT Pub. No.: WO2022/243497
PCT Pub. Date: Nov. 24, 2022

(65) Prior Publication Data
US 2024/0255132 A1    Aug. 1, 2024

(30) Foreign Application Priority Data

May 21, 2021 (FR) ...................................... 2105338

(51) Int. Cl.
*H05K 1/02* (2006.01)
*F21S 41/141* (2018.01)
(Continued)

(52) U.S. Cl.
CPC .......... *F21V 23/023* (2013.01); *F21S 41/141* (2018.01); *F21S 45/47* (2018.01); *F21V 29/508* (2015.01);
(Continued)

(58) Field of Classification Search
CPC .... F21V 23/023; F21V 29/508; F21V 23/003; F21V 23/005; F21V 23/02; F21V 29/70;
(Continued)

(56) References Cited

U.S. PATENT DOCUMENTS

| 10,504,848 B1 | 12/2019 | Parto | |
| 2009/0021180 A1* | 1/2009 | Underwood | H05B 45/375 |
| | | | 315/291 |

(Continued)

FOREIGN PATENT DOCUMENTS

| EP | 3 209 098 A1 | 8/2017 | |
| EP | 3273147 A1 * | 1/2018 | ............ F21S 41/141 |

(Continued)

OTHER PUBLICATIONS

Search English translation of EP-3273147-A1 (Year: 2018).*

(Continued)

*Primary Examiner* — Omar Rojas Cadima
(74) *Attorney, Agent, or Firm* — Oblon, McClelland, Maier & Neustadt, L.L.P.

(57) ABSTRACT

A light module for a motor vehicle includes a light source and a printed circuit supporting a converter circuit intended to supply the light source with electricity. The converter circuit includes at least one electronic power component. A first face of the printed circuit houses a first part of the converter circuit, and a second face of the printed circuit houses a second part of the converter circuit. The at least one electronic power component is integrated into the substrate of the printed circuit.

20 Claims, 2 Drawing Sheets

(51) Int. Cl.
*F21S 45/47* (2018.01)
*F21V 23/02* (2006.01)
*F21V 29/508* (2015.01)
*F21Y 115/10* (2016.01)
*H02M 3/158* (2006.01)

(52) U.S. Cl.
CPC ........ *H05K 1/0206* (2013.01); *F21Y 2115/10* (2016.08); *H02M 3/158* (2013.01); *H05K 2201/1003* (2013.01); *H05K 2201/10106* (2013.01); *H05K 2201/10545* (2013.01)

(58) Field of Classification Search
CPC .... F21V 3/0615; H05K 1/185; H05K 1/0206; H05K 2201/1003; H05K 2201/10166; H05K 2201/10545; H05K 2201/10106; H05K 1/00; H05K 1/0245; H05K 1/0243; H05K 1/0231; H05K 1/111; H05K 1/112; H05K 1/113; H05K 1/114; H05K 1/116; H05K 1/115; H05K 1/141; H05K 1/142; H05K 1/144; H05K 1/181; H05K 1/182; H05K 1/183; H05K 1/184; H05K 1/186; H05K 1/187; H05K 1/188; F21S 41/141; F21S 2/005; F21Y 2115/10; F21Y 2101/00; F21Y 2103/00; F21Y 2105/00; F21Y 2107/00; F21Y 2109/00; F21Y 2111/00; F21Y 2115/00; F21Y 2113/00; F21Y 2105/18; F21Y 2113/13; F21Y 2113/20; H01L 2224/48149; H01L 2224/48151; H01L 2224/48153; H01L 2224/48195; H01L 2224/48265; H01L 25/167; H01L 27/153; H01L 27/156; Y02B 20/30; F21K 9/232
See application file for complete search history.

(56) References Cited

U.S. PATENT DOCUMENTS

| | | |
|---|---|---|
| 2017/0241624 A1 | 8/2017 | Badia |
| 2020/0205280 A1 | 6/2020 | Lee |
| 2020/0350255 A1 | 11/2020 | Parto |
| 2021/0372583 A1 | 12/2021 | Daroussin et al. |

FOREIGN PATENT DOCUMENTS

| | | | | |
|---|---|---|---|---|
| EP | 3 675 163 A1 | 7/2020 | | |
| FR | 3055943 A1 | * 3/2018 | ........... | B60Q 1/0017 |
| FR | 3 088 408 A1 | 5/2020 | | |

OTHER PUBLICATIONS

Search English translation of FR-3055943-A1 (Year: 2018).*
International Search Report Issued Aug. 26, 2022, in PCT/EP2022/063681, filed on May 20, 2022, 2 pages.

* cited by examiner

LIGHT-EMITTING MODULE WITH COMPACT CONVERTER CIRCUIT

This invention relates to the field of lighting systems for motor vehicles, and in particular it relates to such systems using light sources supplied with electricity by a converter circuit.

A light-emitting diode (LED) is an electronic semiconductor component capable of emitting light with a predetermined wavelength when an electric voltage that is at least equal to a threshold value is applied across its terminals. Above this threshold value, which is called the forward voltage, the intensity of the luminous flux emitted by an LED generally increases with the average amplitude of the supply current. Their small size and low electricity consumption make LED components advantageous in the field of light modules for motor vehicles. LED type light sources can be used, for example, to produce distinctive optical signatures by placing the components along predetermined outlines. The use of LED components also facilitates the production of lights able to perform multiple lighting functions.

It is also known for pixelated light sources to be used in various types of technologies to project these light beams according to image data. For example, this involves monolithic technology, in which a high number of LED type elementary sources, equivalent to pixels, are etched into a common semiconductor substrate. The substrate can further comprise on-board electronic components, such as switching circuits or the like.

Pixelated light sources can be used to carry out "high beam" functions (HH, High Beam), or complex functions such as ADB (Alpha Adaptive Driving Beam) or the like.

In order to guarantee a suitable power supply for the light sources carrying out a given light function for a motor vehicle, the use of a control circuit comprising a switched-mode converter is known. Typically, the duty cycle of the switching switch is determined as a function of a current setpoint value to be supplied in order to carry out the light function, and of a return value originating from a control loop, with the return value representing the intensity of the current actually supplied by the converter to the sources. For the supply of electricity to a voltage-controlled light source, it is important that a substantially constant voltage level is provided over time. This function also can be guaranteed by using a switched-mode converter circuit.

At a high switching frequency, such converter circuits can result in electromagnetic incompatibilities with other electronic modules forming part of a light system for a motor vehicle. The converter circuits generally have a significant spatial footprint and represent heat sources when they operate within a system that is produced in a limited volume.

The aim of the invention is to overcome at least one of the problems raised by the prior art.

According to a first aspect of the invention, a light module for a motor vehicle is proposed. The module comprises a light source and a printed circuit supporting a converter circuit intended to supply the light source with electricity. The converter circuit comprises at least one electronic power component. It is noteworthy in that a first face of the printed circuit houses a first part of the converter circuit, a second face of the printed circuit houses a second part of the converter circuit, and in that said at least one electronic power component is integrated into the substrate of the printed circuit.

Preferably, the first part of the converter circuit can comprise passive electronic components. Preferably, the first part can comprise all the passive electronic components of the converter circuit. It preferably can involve resistors and capacitors.

The second part of the converter circuit can preferably comprise an inductor. Preferably, the second part of the converter circuit can comprise all the inductors of the converter circuit.

The first and second parts of the converter circuit, as well as the at least one electronic power component, preferably can be aligned on an axis perpendicular to the first and to the second face of the printed circuit.

Preferably, the at least one electronic power component can comprise a transistor intended to act as a switch in the converter circuit. It preferably can involve a field-effect transistor.

The at least one electronic power component preferably can be included in an integrated circuit embedded in the substrate of the printed circuit.

The printed circuit preferably can be a printed circuit made of several layers, allowing components to be included in the substrate.

Preferably, the integrated circuit can be in contact with a copper layer inside the substrate of the printed circuit.

The module preferably can comprise a heat dissipation element, on which the integrated circuit is placed with its second face. The heat dissipation element preferably can comprise a recess intended to accommodate the second part of the converter circuit. The depth of the recess preferably is at least equal to the height occupied by the components of the second part of the converter circuit relative to the second surface of the printed circuit. The heat dissipation element preferably comprises aluminum. It preferably involves a radiator element.

The copper layer inside the substrate of the printed circuit preferably can be thermally connected to the heat dissipation element by at least one via.

Preferably, the light source can be supported by the first face of said printed circuit.

Preferably, the light source can comprise a light source with a light-emitting semiconductor element, and notably a pixelated light source.

By using the measures proposed by the present invention, it is then possible to propose a compact light module, in which the spatial footprint of the converter circuit supplying a light source is greatly reduced compared to known solutions. Such a configuration is advantageous within the context of producing an automotive headlamp, for which the available volume is generally limited. In addition, the compact aspect of the converter circuit allows a plurality of light sources to be housed in a relatively limited space, if this is required by the presence of a plurality of light sources. The small dimensions are achievable by dividing the electronic components of the converter circuit not only on either side on two faces of the printed circuit supporting it, but by disposing power semiconductor elements, such as, for example, the transistors acting as switching switches of the converter circuit, in the substrate of the printed circuit itself. This arrangement also reduces the risk of any electromagnetic incompatibilities with respect to other electronic circuits that are located in a light device of a motor vehicle. On the one hand, the current loops inside the converter circuit are reduced in size. On the other hand, according to preferred embodiments, the one or more inductors of the circuit are shielded by their disposition in a recess integrally formed in a metal heat dissipation element. This arrangement also allows efficient heat dissipation of the heat produced by the converter circuit when it operates.

Further features and advantages of the present invention will be better understood from the description of the examples and of the drawings, in which.

Unless otherwise specified, technical features described in detail with respect to a given embodiment can be combined with the technical features described within the context of other embodiments described by way of non-limiting examples.

The description focuses on the light module elements for a motor vehicle that are necessary for understanding the invention. Other elements, which, for example, are necessary for the operation of the light sources and their ability to project light beams, are per se known in the art and will not be mentioned or described in detail. The same applies for structural elements implicitly forming part of such light modules. For example, the presence of a support or of optical elements are implicit for the operation of such a module.

A printed circuit as used in embodiments of the present invention preferably, and in a known manner, comprises several layers. The substrate is typically made of a non-conductive epoxy resin or using a composite material. The printed circuit notably can comprise electrically conductive copper layers. Electrical contacts between the conductive layers are produced by vias similar to copper channels that perforate one or more insulating layers of the printed circuit. In a known manner, electronic components, such as resistors, capacitors, inductors or integrated circuits can be mounted on the surface of a printed circuit. The electrical connections between the components are produced by copper tracks. Methods intended to produce the tracks, vias, or the surface mounting of components or connectors involve different electrochemical reactions that are well known in the art and will not be described within the scope of the present invention.

Figure 1:
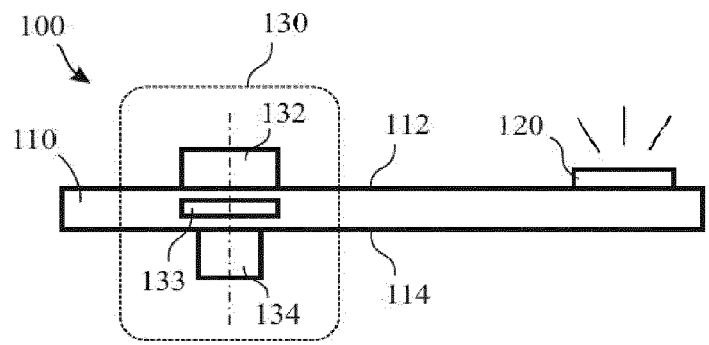
FIG. 1 shows a schematic illustration of a cross-section through a printed circuit as used in a preferred embodiment of the invention.

FIG. 1 schematically shows a cross-section through the thickness of a light module 100 for a motor vehicle. The module comprises a generally flat printed circuit 110 having two opposite faces 112, 114. In the example shown, and in a non-limiting manner, the printed circuit 110 acts as a support for at least one light source 120. Alternatively, the light source can be supported, for example, by a heat dissipation element or another support. In such a case, the light source can be connected to an electronic circuit of the printed circuit 110, for example, by means of a bridging electrical connection of the "wire bonding" type that is per se known in the art. The printed circuit also acts as a support for a converter circuit 130. The light source preferably can be a light source with a light-emitting semiconductor element, such as a light-emitting diode (LED) or a pixelated light source using a significant number of elementary light sources in the form of a matrix.

In the example shown, the light source 120 is electrically connected to the converter circuit 130 by conductive tracks of the printed circuit (not shown). The converter circuit 130 is intended to supply the light source with electricity and it comprises a mounting that uses at least one electronic power component 133. A plurality of converter circuit architectures is known in the art. This notably involves switched-mode circuits that allow a direct voltage to be supplied as output with a higher or lower value than the electric voltage provided at its input. By way of examples, the converter circuit 130 can implement, for example, a "boost" type architecture that is per se known. Other converter circuits, such as a buck-type circuit or flyback circuits, as well as SEPICs (single ended primary inductor converter), can, depending on the selected application, be used without departing from the scope of the invention. Such converter circuits 130 are generally controlled by a pulse width modulation signal acting on a switch and defining the switching frequency of the converter. Typically, the switch is produced by a field-effect transistor: this is an example of an electronic power component 133.

The first face 112 of the printed circuit 110 houses, in the example shown, the light source 120 and a first part 132 of the converter circuit, while the second face 114 of the printed circuit houses a second part 134 of the converter circuit 130. The at least one electronic power component 133 is integrated into the substrate of the printed circuit, according to production methods that are known in the art. This choice of mounting allows the footprint of the converter circuit to be reduced on each of the individual faces of the printed circuit. This footprint is reduced even more as the three parts 132, 133, 134 are generally aligned above, respectively, below each other along an axis perpendicular to the plane of the printed circuit 110, as shown in a non-limiting manner in FIG. 1. Preferably, the first part 132 of the converter circuit can group the passive components (for example, the resistors and the capacitors) that are used in the mounting, while the second part 134 groups together all the inductors, for example.

Figure 2:
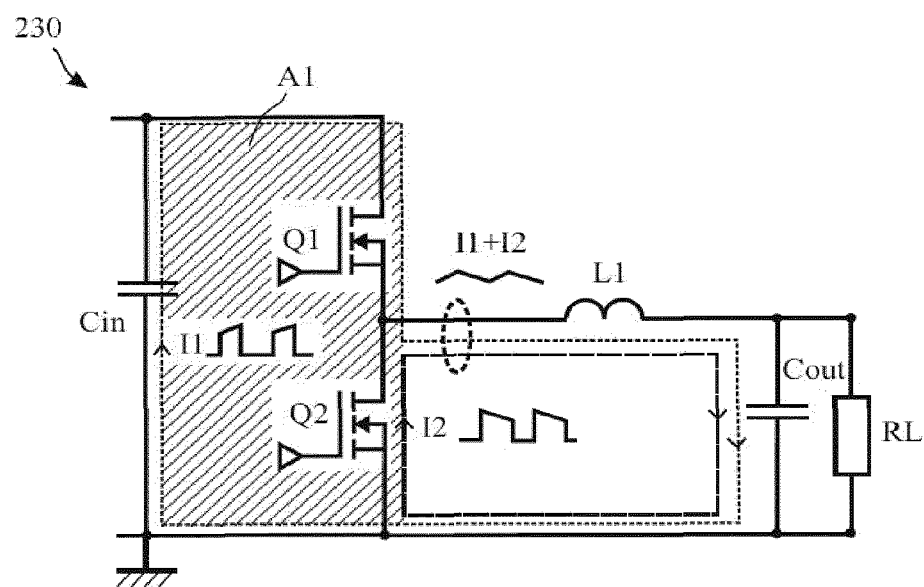
FIG. 2 shows a circuit diagram of an electronic circuit producing a converter, as is known in the prior art.

FIG. 2 shows a circuit diagram of a converter circuit 230 that is per se known from the prior art. It is used to supply a DC voltage to a load symbolized by the resistor RL. By means of the switching frequencies that govern the opening and closing states of the switches Q1 and Q2, and by using the features of the inductor L1, the circuit is capable of producing a continuous electric current I1+I2 by superposing two discontinuous currents I1 and I2, respectively. The current loops I1 and I2 are illustrated, as well as the surface A1 having the part of the circuit that conveys only the signal I1 as a perimeter. At a high switching frequency, the signals I1 and I2 are high-frequency signals, which, together with the inductor L1, risk generating electromagnetic incompatibilities with other electronic circuits.

Figure 3:
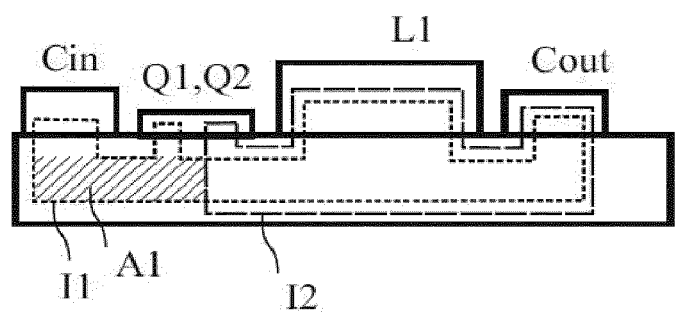
FIG. 3 shows a schematic illustration of a cross-section through a printed circuit that produces the circuit of FIG. 2, as is known in the prior art.

FIG. 3 shows an embodiment of the circuit diagram of FIG. 2 as is known in the art. This acts as a reference. The capacitors Cin, Cout, the inductor L1 and an integrated circuit, which produces the semiconductor transistors Q1 and Q1, are mounted on the same surface of an integrated circuit. The current loops I1, I2, as well as the area A1 described within the context of FIG. 2, are also illustrated.

Figure 4:
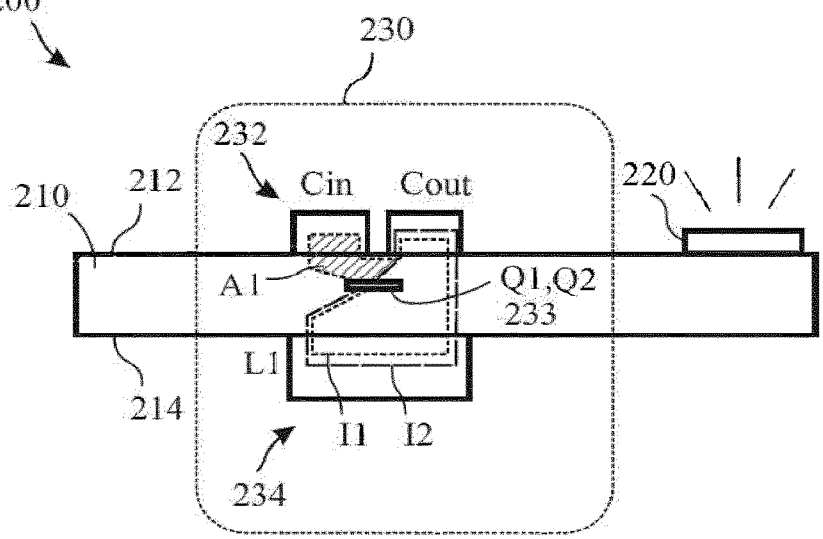
FIG. 4 shows a schematic illustration of a cross-section through a printed circuit that produces the circuit of FIG. 2, in accordance with a preferred embodiment of the invention.

FIG. 4 shows, by way of a comparison, an embodiment 200 of the circuit diagram of FIG. 2 in accordance with an embodiment according to the invention. The illustrated module 200 comprises a printed circuit 210, which on a first surface 212 houses the passive components 232, i.e., the capacitors Cin, Cout, of the converter circuit 230, as well as the light source 220 supplied by this converter circuit.

Alternatively, the light source can be physically remote from the printed circuit, and electrically connected to the converter circuit by a bridging connection, for example. The inductor L1 is mounted on a second opposite surface 214 of the printed circuit 210. This second part 234 of the circuit is capable of generating electromagnetic waves and heating. An integrated circuit 233 that produces the semiconductor transistors Q1 and Q1 is integrated, by means of a manufacturing method that is known in the art, inside the substrate of the printed circuit 210. The electrical connections between the faces 212, 213 and the integrated circuit 233 are produced by copper vias that are not illustrated. By way of an explanation, the current loops I1, I2, as well as the area A1 described within the context of FIG. 2, are also illustrated. It becomes apparent that the topology proposed by the invention allows the scale of the current loops I1, I2, as well as the area A1, to be reduced with respect to the example shown in FIG. 3, thus reducing the risk of electromagnetic radiation toward other electronic circuits. According to a production option, the printed circuit 214 can be placed on a metal radiator element, having a recess in the vicinity of the part 234 of the converter circuit. This not only allows effective dissipation of the heat produced in this part of the circuit, but the presence of a metal mold around the inductor L1 also produces an electromagnetic shield.

Figure 5:
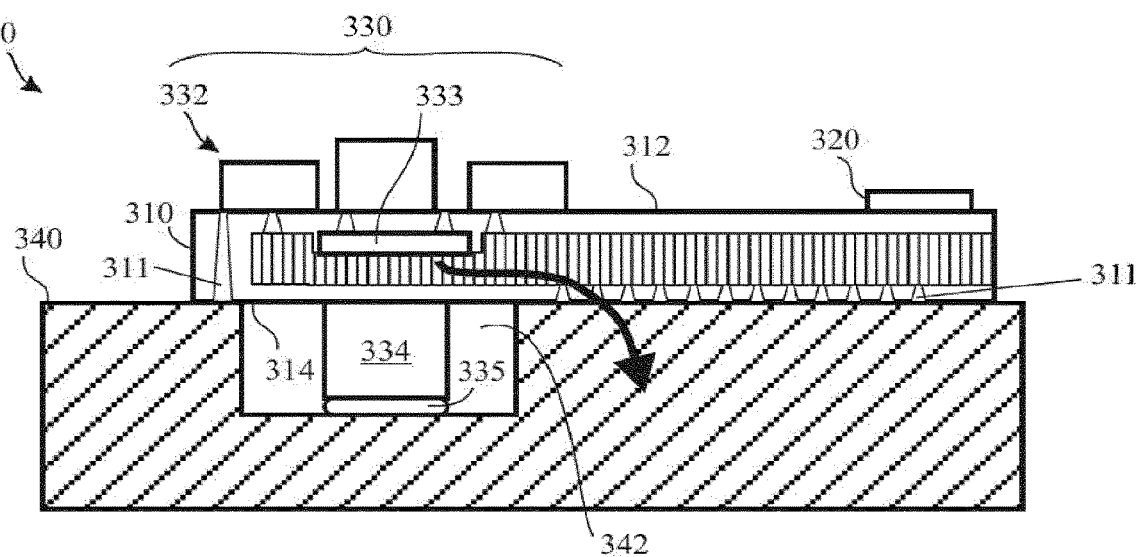
FIG. 5 shows a schematic illustration of a cross-section through a printed circuit as used in a preferred embodiment of the invention.

FIG. 5 shows another preferred embodiment of the invention. A light module 300 comprises a printed circuit 310 that is placed, preferably by means of a thermal and electrically insulating adhesive, on a heat dissipation element 340, such as an aluminum radiator.

The printed circuit comprises a multi-layer substrate and acts as a support for at least one light source 320 intended to be supplied by a converter circuit 330. Alternatively, it is possible to contemplate bonding the light source 320 directly to the heat dissipation element 340, and electrically connecting it to the converter circuit 330 by a bridging type connection. A first part 332 of the converter circuit is supported by a first face 312 of the printed circuit. This first part preferably groups the passive electronic components of the converter circuit 330. A second part 334 of the converter circuit is supported by a second face 314 of the printed circuit. This second part preferably groups the inductors of the converter circuit.

A third part of the converter circuit 330, grouping together electronic power components such as semiconductor transistors, is embedded in one of the internal or intermediate layers of the substrate of the integrated circuit. When a transistor is controlled by a control signal (not shown) at high frequency, it generates heat. In order to dissipate this heat, placing the power elements, grouped together, for example, in an integrated circuit 333, on a relatively thick layer of copper has been proposed, as illustrated in FIG. 5 by the shaded vertical line surface. This copper layer is thermally connected to the heat dissipation element 340 by vias and through the insulating layer. The resulting main thermal discharge path is illustrated by the bold arrow.

Copper vias 311 also allow the copper tracks of the surfaces 312, 314 to be electrically connected together, and allow intermediate layers of the printed circuit to be selectively contacted.

The heat dissipation element 340 comprises a recess 342 that is used to accommodate the electronic components of the second part 334 of the converter circuit that protrude on the second face 314 of the printed circuit 310. As shown in FIG. 5, the depth of the recess is preferably slightly greater than the height of the electronic components relative to the surface 314. This allows the contact between the components 334 and the heat dissipation element to be precisely adapted, for example, by inserting a thermally conductive glue. As described above, the recess 342, which can assume, for example and in a non-limiting manner, a cylindrical shape, implicitly forms an electromagnetic shield around the components of the second part 334 of the converter circuit.

Of course, the described embodiments do not limit the scope of protection of the invention. Using the description provided above, other embodiments can be contemplated, yet without departing from the scope of the present invention.

The scope of protection is defined by the claims.

The invention claimed is:

1. A light module for a motor vehicle comprising a light source and a printed circuit supporting a converter circuit intended to supply the light source with electricity, the converter circuit comprising at least one electronic power component, characterized in that a first part of the converter circuit is located on a first face of the printed circuit and outside the printed circuit, a second part of the converter circuit is located on a second face of the printed circuit and outside the printed circuit, and said at least one electronic power component is integrated into a substrate of the printed circuit.

2. The light module as claimed in claim 1, wherein the second part of the converter circuit comprises an inductor.

3. The light module as claimed in claim 1, wherein the first and second parts of the converter circuit, as well as the at least one electronic power component, are aligned on an axis perpendicular to the first and to the second face of the printed circuit.

4. The light module as claimed in claim 1, wherein the light source is supported by the first face of said printed circuit.

5. The light module as claimed in claim 1, wherein the light source comprises a light source with a light-emitting semiconductor element, and notably a pixelated light source.

6. The light module as claimed in claim 1, wherein at least one electronic power component is included in an integrated circuit embedded in the substrate of the printed circuit.

7. The light module as claimed in claim 6, wherein the integrated circuit is in contact with a copper layer inside the substrate of the printed circuit.

8. The light module as claimed in claim 7, comprising a heat dissipation element, on which the integrated circuit is placed with its second face, the heat dissipation element comprising a recess intended to accommodate the second part of the converter circuit.

9. The light module as claimed in claim 8, wherein said copper layer inside the substrate of the printed circuit is thermally connected by at least one via to the heat dissipation element.

10. The light module as claimed in claim 1, wherein the first part of the converter circuit comprises passive electronic components.

11. The light module as claimed in claim 10, wherein the first and second parts of the converter circuit, as well as the at least one electronic power component, are aligned on an axis perpendicular to the first and to the second face of the printed circuit.

12. The light module as claimed in claim 10, wherein the light source is supported by the first face of said printed circuit.

13. The light module as claimed in claim 10, wherein the light source comprises a light source with a light-emitting semiconductor element, and notably a pixelated light source.

14. The light module as claimed in claim 10, wherein the second part of the converter circuit comprises an inductor.

15. The light module as claimed in claim 14, wherein the passive electronic components include an input capacitor and an output capacitor.

16. The light module as claimed in claim 15, wherein the at least one electronic power component includes a first switch and a second switch, the first switch being governed by a first switch frequency such that a first current loop is produced that flows from the input capacitor, through the first switch, the inductor and the output capacitor, back to the input capacitor, the second switch being governed by a second switch frequency such that a second current loop is produced that flows from the inductor, through the output capacitor and the second switch, back to the inductor.

17. The light module as claimed in claim 10, wherein at least one electronic power component is included in an integrated circuit embedded in the substrate of the printed circuit.

18. The light module as claimed in claim 17, wherein the integrated circuit is in contact with a copper layer inside the substrate of the printed circuit.

19. The light module as claimed in claim 18, comprising a heat dissipation element, on which the integrated circuit is placed with its second face, the heat dissipation element comprising a recess intended to accommodate the second part of the converter circuit.

20. The light module as claimed in claim 19, wherein said copper layer inside the substrate of the printed circuit is thermally connected by at least one via to the heat dissipation element.

* * * * *